US012429526B2

(12) United States Patent
Quelly et al.

(10) Patent No.: US 12,429,526 B2
(45) Date of Patent: Sep. 30, 2025

(54) METHOD AND APPARATUS FOR ESTIMATING THE AVAILABLE RUNTIME OF A BATTERY BACKUP SYSTEM

(71) Applicant: Phoenix Broadband Technologies, LLC, Hatfield, PA (US)

(72) Inventors: Michael L. Quelly, Quakertown, PA (US); Walter Michael Wilczewski, Glenside, PA (US)

(73) Assignee: Phoenix Broadband Technologies, LLC, Hatfield, PA (US)

( * ) Notice: Subject to any disclaimer, the term of this patent is extended or adjusted under 35 U.S.C. 154(b) by 340 days.

(21) Appl. No.: 17/807,091

(22) Filed: Jun. 15, 2022

(65) Prior Publication Data
US 2023/0021521 A1    Jan. 26, 2023

Related U.S. Application Data

(60) Provisional application No. 63/225,254, filed on Jul. 23, 2021.

(51) Int. Cl.
*G01R 31/388*    (2019.01)
*G01R 31/367*    (2019.01)
(Continued)

(52) U.S. Cl.
CPC ......... *G01R 31/388* (2019.01); *G01R 31/367* (2019.01); *G01R 31/392* (2019.01); *H01M 10/06* (2013.01); *H01M 10/441* (2013.01); *H01M 10/482* (2013.01); *H02J 7/0013* (2013.01); *H02J 7/0031* (2013.01);
(Continued)

(58) Field of Classification Search
CPC .. G01R 31/388; G01R 31/367; G01R 31/392; G01R 31/382; G01R 31/379; G01R 31/3646; H01M 10/06; H01M 10/441; H01M 10/482; H01M 2220/10; H01M 10/448; H02J 7/0013; H02J 7/0031; H02J 7/0047; H02J 7/005; H02J 7/0063; H02J 2207/20; H02J 9/061; H02J 7/0048
See application file for complete search history.

(56) References Cited

U.S. PATENT DOCUMENTS 5,615,129 A    3/1997    Stich et al.
6,317,697 B1 *    11/2001    Yoshikawa ...... G01R 19/16542
          320/149
(Continued)

FOREIGN PATENT DOCUMENTS

CN    106842036 A    6/2017
KR    20030013701 A    2/2003
(Continued)

Primary Examiner — Mohammad K Islam

(57) ABSTRACT

A battery monitoring system continuously calculates the estimated runtime of a bank of batteries in a battery backup system during both a period of operation when the load current is supplied by a commercial source of AC power and during a period of operation when the commercial source of AC power is not present and the load current is supplied by the bank. The estimated runtime may be displayed to an operator and used to alert the operator if the cutoff voltage of a battery in the bank is at or near its cutoff voltage. The system may open a circuit breaker to avoid catastrophic damage before the cutoff voltage is reached.

16 Claims, 7 Drawing Sheets

(51) Int. Cl.
*G01R 31/392* (2019.01)
*H01M 10/06* (2006.01)
*H01M 10/44* (2006.01)
*H01M 10/48* (2006.01)
*H02J 7/00* (2006.01)

(52) U.S. Cl.
CPC ............ *H02J 7/0047* (2013.01); *H02J 7/005* (2020.01); *H02J 7/0063* (2013.01); *H02J 2207/20* (2020.01)

(56) References Cited

U.S. PATENT DOCUMENTS

| | | | |
|---|---|---|---|
| 6,892,148 | B2 | 5/2005 | Barsoukov et al. |
| 7,349,816 | B2 | 3/2008 | Quint et al. |
| 7,970,560 | B2 | 6/2011 | Rocci et al. |
| 8,032,316 | B2 | 10/2011 | Rocci et al. |
| 8,311,753 | B2 | 11/2012 | Rocci et al. |
| 8,428,894 | B2 | 4/2013 | Rocci et al. |
| 8,504,314 | B2 | 8/2013 | Rocci et al. |
| 8,660,808 | B2 | 2/2014 | Yu |
| 8,660,809 | B2 | 2/2014 | Yu |
| 9,774,205 | B2 | 9/2017 | Cohen et al. |
| 10,295,608 | B2 | 5/2019 | Rocci et al. |
| 10,578,678 | B1* | 3/2020 | Hudson ................ G01R 31/007 |
| 10,705,153 | B2 | 7/2020 | Kondo |
| 11,150,305 | B2* | 10/2021 | Jokar .................... G01R 31/392 |
| 11,218,003 | B2 | 1/2022 | Rocci et al. |
| 11,237,216 | B1* | 2/2022 | Chang .................... B60L 58/12 |
| 11,862,771 | B1* | 1/2024 | Cooper ............... H01M 10/425 |
| 2005/0288878 | A1* | 12/2005 | Ng .................... G01R 31/3842 |
| | | | 702/63 |
| 2008/0208535 | A1* | 8/2008 | Suzuki ................ H01M 10/486 |
| | | | 702/184 |
| 2009/0195211 | A1* | 8/2009 | Wang .................... G01R 31/392 |
| | | | 320/136 |
| 2009/0195212 | A1* | 8/2009 | Chiasson ............. G01R 31/392 |
| | | | 320/136 |
| 2010/0157459 | A1* | 6/2010 | Mueller ................ G11B 5/035 |
| | | | 369/59.19 |
| 2011/0054817 | A1 | 3/2011 | Burgett |
| 2012/0248876 | A1* | 10/2012 | Tamura ................ G01R 31/392 |
| | | | 307/66 |
| 2012/0249152 | A1* | 10/2012 | Nishibayashi ........ H02J 7/0063 |
| | | | 324/430 |
| 2015/0214753 | A1* | 7/2015 | Shenoy ................. H02J 7/0016 |
| | | | 320/134 |
| 2016/0116548 | A1* | 4/2016 | Ghantous ............ H01M 10/425 |
| | | | 702/63 |
| 2017/0047745 | A1 | 2/2017 | Chambom |
| 2018/0196107 | A1* | 7/2018 | Fleischer ............. G01R 31/367 |
| 2018/0252775 | A1* | 9/2018 | Wu ........................ H01M 10/48 |
| 2019/0101595 | A1 | 4/2019 | Kondo |
| 2020/0010034 | A1* | 1/2020 | Xavier ...................... H02J 9/06 |
| 2020/0110135 | A1* | 4/2020 | Zeier .................... H02J 7/00711 |
| 2020/0203780 | A1* | 6/2020 | Mandli ................ H02J 7/00712 |
| 2021/0099003 | A1* | 4/2021 | Zhu ...................... H01M 10/443 |
| 2022/0158480 | A1* | 5/2022 | Sasahara ............... H02J 7/0048 |
| 2023/0021521 | A1* | 1/2023 | Quelly .................. H02J 7/0048 |
| 2024/0201276 | A1* | 6/2024 | Tsuda ..................... G07C 5/0808 |

FOREIGN PATENT DOCUMENTS

| | | |
|---|---|---|
| KR | 20160030643 A | 3/2016 |
| WO | 2018126901 A1 | 7/2018 |
| WO | 2020188285 A1 | 9/2020 |
| WO | 2021000905 A1 | 1/2021 |

* cited by examiner

FIG. 5

| Company | Product Line | Battery Model Number | Cells per Bloc | Amp Hour Rating | Expected Life (Years) | New Cell Admittance | 1 min | 3 min | 5 min | 10 min | 15 min | 30 min | 45 min | 1 hr 60 | 2 hr 120 | 3 hr 180 | 4 hr 240 | 5 hr 300 | 6 hr 360 | 7 hr 420 | 8 hr 480 | 10 hr 600 | 20 hr 1200 |
|---|---|---|---|---|---|---|---|---|---|---|---|---|---|---|---|---|---|---|---|---|---|---|---|
| Enersys | PowerSafe | SBS15 | 6 | 14 | 10 | 444 | | | | 0 | 33 | 20 | 14 | 11 | 6 | 4 | 3 | 3 | 2 | 2 | 2 | 2 | 1 |
| Enersys | PowerSafe | SBS40 | 6 | 38 | 10 | 1071 | 0 | | 0 | 0 | 83 | 67 | 37 | 29 | 16 | 11 | 9 | 7 | 6 | 5 | 5 | 4 | 2 |
| Enersys | PowerSafe | SBS60 | 6 | 51 | 10 | 1364 | | | | | 109 | 67 | 49 | 39 | 22 | 16 | 12 | 10 | 8 | 7 | 7 | 5 | 3 |
| Enersys | PowerSafe | SBSC11 | 6 | 91 | 10 | 1091 | | | | | 173 | 109 | 81 | 65 | 37 | 26 | 21 | 17 | 15 | 13 | 11 | 10 | 5 |
| Enersys | PowerSafe | SBS100F | 6 | 100 | 10 | 1364 | | | | | 196 | 126 | 94 | 75 | 43 | 31 | 24 | 19 | 17 | 14 | 13 | 11 | 6 |
| Enersys | PowerSafe | SBS170F | 6 | 170 | 10 | 1500 | | | | | 306 | 203 | 153 | 123 | 72 | 51 | 40 | 33 | 28 | 24 | 21 | 18 | 10 |
| Enersys | PowerSafe | SBS190F | 6 | 190 | 10 | 1818 | 0 | 0 | 0 | 0 | 345 | 226 | 171 | 138 | 80 | 57 | 45 | 37 | 31 | 27 | 24 | 20 | 11 |
| Enersys | PowerSafe | DDm100-21 | 1 | 1000 | 10 | 3704 | 1306 | | | | 1006 | 799 | 671 | 575 | 369 | 271 | 219 | 184 | 159 | 142 | 126 | 104 | 56 |
| C&D | TEL | TEL12-210F | 6 | 202 | 10 | 1500 | | | | | | | | 138 | 83 | 57 | 44 | 38 | 32 | 28 | 25 | 21 | 12 |
| GNB | Absolyte IIP | 90A07 | 1 | 265 | 20 | ? | 352 | | | | 264 | 214 | | 151 | 93 | 69 | 55 | 47 | 41 | 36 | 32 | 27 | 12 |
| GNB | Absolyte IIP | 90A15 | 1 | 615 | 20 | ? | 737 | | | | 618 | 499 | | 352 | 217 | 162 | 130 | 110 | 96 | 85 | 76 | 64 | 35 |
| GNB | Absolyte IIP | 100A21 | 1 | 1000 | 20 | ? | 1187 | | | | 932 | 744 | | 520 | 354 | 246 | 213 | 179 | 156 | 138 | 124 | 104 | 50 |
| GNB | Absolyte GP | 90G15 | 1 | 608 | 20 | ? | 737 | | | | 618 | 499 | | 352 | 217 | 162 | 130 | 110 | 96 | 85 | 76 | 64 | 35 |
| Exide | Marathon | M12V155 | 6 | 158 | 12 | 1579 | | 433 | 360 | 300 | 250 | 169 | | 103 | 61 | 44 | | 29 | | | 19 | 16 | 7 |
| East Penn | Unigy I | 12AVR150ET | 6 | 150 | 10 | 1550 | 0 | 0 | 0 | 0 | 0 | 0 | 0 | 97 | 56 | 41 | 32 | 27 | | 19 | | | 7 |
| East Penn | Unigy I | 12AVR170ET | 6 | 170 | 10 | 2100 | 0 | 0 | 0 | 0 | 0 | 0 | 0 | 108 | 64 | 46 | 37 | 31 | | 21 | | | 9 |
| East Penn | Unigy I | 12AVR200ET | 6 | 200 | 10 | 2900 | 0 | 0 | 0 | 0 | 0 | 0 | 0 | 152 | 86 | 60 | 47 | 38 | | 25 | | | 11 |
| East Penn | Unigy II | AVR45-5 | 1 | 91 | 10 | ? | | | | | | | | 52 | 32 | 24 | 19 | 16 | 14 | 12 | 11 | 10 | 6 |
| East Penn | Unigy II | AVR45-7 | 1 | 137 | 10 | ? | | | | | | | | 76 | 47 | 36 | 29 | 25 | 22 | 19 | 17 | 14 | 8 |
| East Penn | Unigy II | AVR45-9 | 1 | 183 | 10 | ? | | | | | | | | 105 | 63 | 48 | 39 | 33 | 29 | 26 | 23 | 19 | 11 |
| East Penn | Unigy II | AVR45-11 | 1 | 229 | 10 | ? | | | | | | | | 131 | 79 | 60 | 48 | 41 | 36 | 32 | 29 | 24 | 13 |
| East Penn | Unigy II | AVR45-13 | 1 | 274 | 10 | ? | | | | | | | | 157 | 95 | 71 | 58 | 49 | 43 | 38 | 34 | 29 | 16 |
| East Penn | Unigy II | AVR45-15 | 1 | 320 | 10 | ? | | | | | | | | 183 | 110 | 83 | 68 | 58 | 50 | 44 | 40 | 34 | 19 |
| Alpha | AlphaCell | 100XTV | 6 | 56 | 5 | 1380 | | | | | | | | 39 | 22 | 16 | 12 | 10 | 9 | | 7 | 5 | 3 |
| Alpha | AlphaCell | 150XTV | 6 | 80 | 5 | 1533 | | | | | | | | 53 | 31 | 22 | 17 | 14 | 12 | | 9 | 8 | 4 |
| Alpha | AlphaCell | 195XTV | 6 | 100 | 5 | 1769 | | | | | | | | 66 | 38 | 27 | 21 | 17 | 15 | | 11 | 9 | 5 |
| Alpha | AlphaCell | 240XTV | 6 | 112 | 5 | 2029 | | | | | | | | 82 | 46 | 32 | 25 | 20 | 17 | | 13 | 11 | 6 |
| Battery Energy | Sun GEL Ultra2SGU200FTG-H | | 6 | 205 | 16 | 1333 | 148 | | 130 | 121 | 111 | | | 106 | 119 | 139 | 147 | 149 | | | 164 | 167 | 185 |
| Saft | SPL+ | SPL+130 | 1 | 130 | 20 | 500 | | | | | | 101 | | 87 | 60 | 44 | | 27 | | | 18 | 14 | |

METHOD AND APPARATUS FOR ESTIMATING THE AVAILABLE RUNTIME OF A BATTERY BACKUP SYSTEM

This application claims priority to U.S. Provisional Patent Application No. 63/225,254 filed Jul. 23, 2021 ("the Provisional Application"). The entirety of the Provisional Application is incorporated herein by reference as if the content thereof had been stated herein.

INCORPORATION BY REFERENCE

Subject to the following clarifications and qualifications, the following U.S. Patents and U.S. Patent Publications (collectively "the References") are also incorporated herein by reference in their entireties as if the contents thereof had been stated herein. No subject matter of the Provisional Application or the References that is contrary to the instant disclosure is incorporated herein. No claims of the Provisional Application or the References are incorporated herein. In the event of inconsistencies between this disclosure and the Provisional Application or References, the Provisional Application and the References should be considered supplementary hereto, and the instant disclosure controls in the event of any irreconcilable inconsistencies. Information in the Provisional Application and the References is incorporated herein only to the extent that no conflict exists between such information this disclosure. In the event of a conflict that would render any claim hereof invalid, then such conflicting information is specifically not incorporated by reference herein. The References are U.S. Pat. Nos. 8,032,316; 8,428,894; 7,970,560; 8,311,753; 8,504,314; and 10,295,608; and 11,218,003.

FIELD OF THE DISCLOSURE

The instant disclosure relates generally to battery power backup systems. More particularly, the instant disclosure relates to a system and method for estimating the available runtime of a battery power backup system when power is being supplied to a load by the battery power backup system during, e.g., a utility company service outage.

BACKGROUND

A battery power backup power system (hereafter sometimes "backup system") supplies power to a load when AC power is not available, e.g., during a service outage. In commercial applications, backup systems are frequently employed to supply power to mission critical operations during the service outage.

One example of a mission critical operation is a cell phone tower transmission system that includes one or more antennas and a base station housing electronic communication equipment for receiving and transmitting cell phone signals. In normal operation, the electronic communication equipment (load) is powered by a charger (sometimes called a rectifier) that receives AC power supplied by a commercial source, such as a utility company. The charger is connected to both the load and a battery bank, such that the charger charges the bank and supplies power to the load when commercial AC power is present. During a service outage, however, the load is powered by the battery bank, which typically comprises a plurality of lead acid blocs connected together in strings to define the bank. Particularly in such mission critical operations, it is highly desirable to know how long the bank can reliably supply power to the load in the event of a service outage so that an operator is on notice that remedial measures may need to be taken if the outage period is likely to exceed the time that the bank can reliably supply power to the load. For example, the operator may need to ensure that generator power is available. As another example, this information is useful in determining whether additional blocs should be added to the bank or whether aging blocs should be replaced.

Traditionally the estimated runtime of a battery is calculated using either the battery manufacturer's discharge curves or the voltage slope during discharge. The slope method will initially provide a longer runtime which will decrease as the discharge progresses. The discharge curve method is accurate with new batteries, but as the battery ages and the capacity falls, this estimate becomes less accurate.

SUMMARY

There is disclosed a system for providing an estimate of the runtime of a battery backup system both during a time when a normal supply of current is powering a load ("normal operation" or "charging period") and during a time when the normal supply of current is not present and the backup system is supplying the current to power the load ("discharge event"). The system comprises a plurality of sensors, each for providing information indicative of at least one health related characteristic of an associated battery of a plurality of batteries ("bank"), wherein each bank comprises a plurality of series connected batteries ("strings"). As explained in U.S. Pat. No. 11,218,003, the health-related characteristic is obtained by applying a pulse width modulated (PWM) signal to each battery via a sensor so as to excite the battery. The battery responds with a signal that is indicative of the battery's admittance, which is an indication of the battery's health. The system also comprises a controller having a memory, a processor and program code stored in the memory for execution by the processor. The program code causes the processor to estimate runtime during both normal operation and a discharge event by carrying out the following steps:

during normal operation: (i) provide an estimate of an amount of current required to be supplied by the bank during an occurrence of the discharge event ("estimated discharge current"); (ii) continuously calculate an estimated amp hour capacity of each string; (iii) continuously calculate a value indicative of the health of each string, defining a quality index; (iv) continuously calculate an adjusted estimated amp hour capacity of each string by applying the quality index to the estimated amp hour capacity of the string; (v) continuously calculate an estimated amp hour capacity of the bank based upon the number of strings and the adjusted estimated amp hour capacity of each string; and, (vi) continuously calculate a first estimated runtime of the bank based on the estimated amp hour capacity of the bank and the estimated discharge current; and during a discharge event: (i) detect the occurrence of a coup de fouet; (ii) determine when the voltage level of the bank has stabilized after the occurrence of the coup de fouet, and thereafter continuously (A) calculate a change of bank voltage vs. time ("voltage slope"); and (B) calculate an estimated time to cutoff based on the voltage slope and bank voltage ("second estimated runtime"); and (iii) continuously: (A) calculate the quality index; (B) calculate a third estimated runtime by applying the quality index to one of a measured discharge current or the estimated discharge current, wherein the estimated discharge current is employed in a first instance of a discharge event and the measured discharge current is employed in subsequent discharge events; (C) compare the second and third estimated runtimes; and (D) select the shortest of the second and third estimated runtime ("selected estimated runtime").

As also explained U.S. Pat. No. 11,218,003, the controller (referred to as a site control unit U.S. Pat. No. 11,218,003) receives the health indications and periodically transmits that indication and the indications of battery voltage to a central monitoring location via a network.

The system displays the first estimated runtime during normal operation and the selected estimated runtime during the discharge event and further generates an alert if any battery in the bank has reached the cutoff voltage. The system may also cause a circuit breaker to trip and disconnect the bank from the load if any battery in the bank has reached the cutoff voltage.

BRIEF DESCRIPTION OF THE DRAWINGS

FIG. 5 is a chart illustrating exemplary manufacturer data that may be stored in the controller memory relating to each battery (bloc) in the bank.

DETAILED DESCRIPTION

Figure 1A:
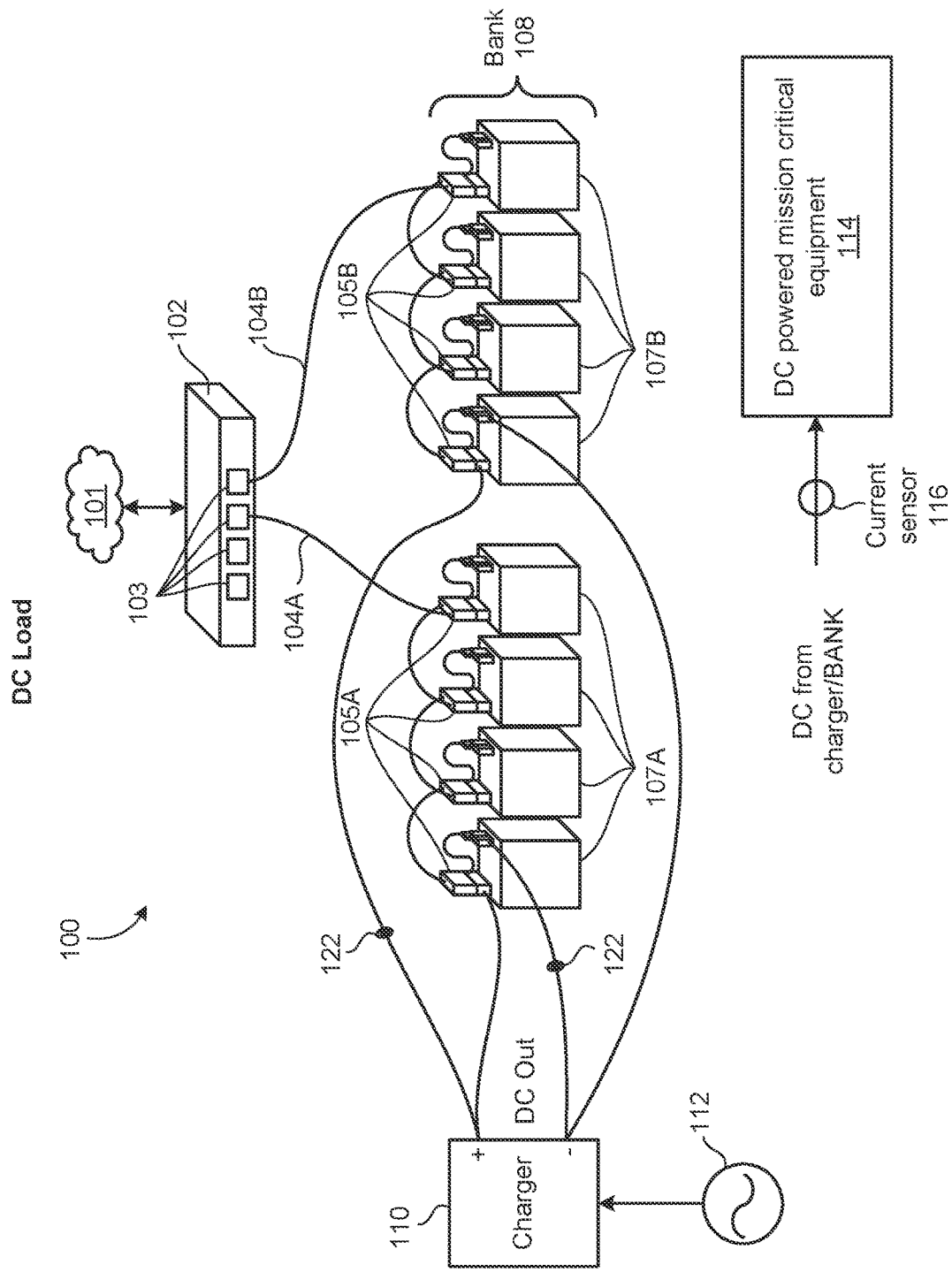
FIG. 1A is a block diagram of an exemplary battery backup and management system for a DC load.

Those skilled in the art will recognize that the disclosed method and apparatus may be combined with or implemented as a part of the methods and apparatuses disclosed in one or more of the References, and such combinations and implementations form a part of this disclosure. For example, the disclosed method and apparatus may be implemented in the Phoenix Broadband Technologies Site Controller Unit, PBT-PA-BMS-SC4 (https://www.phoenixbroadband.com/wp-content/uploads/2020/01/PBT-Data-Sheet-PBT-PA-BMS-SC4.pdf., also incorporated herein by reference). Such system (and those disclosed in the References) is sometimes referred to herein as a battery management system, or "BMS".

The following Terms may be employed throughout this disclosure. The descriptions of the Terms below are provided solely for purposes of expediency and are not intended to limit their meaning to the accompanying specific verbiage. The descriptions of these Terms are not definitions, are not intended to define any claim terms, and are not for purposes of ascertaining claim scope or claim construction. They are not intended to limit the scope of the claims to the specific verbiage unless otherwise specified or unless clearly implicit from the context in which they are used.

Adjusted Estimated Amp Hour Capacity-When used in connection with a String, the Estimated Amp Hour Capacity of the String before a Discharge Event has occurred after taking into account factors such as battery health, state of charge, age, temperature and other battery characteristics. The term "derating" is sometimes used to express this concept. Adjusted Estimated Amp Hour Capacity of a String may be calculated by multiplying the Estimated Amp Hour Capacity of the String by the QI.

Bank-A collection of Strings connected in parallel, sometimes referred to as the battery bank.

Bloc-one or more Cells connected in series and contained in a single package.

Typically, a Bloc is a collection of lead acid Cells. The terms "bloc" and "battery" are sometimes used interchangeably herein.

Cell-A single unit device within a Bloc that converts chemical energy into electrical energy.

Coup de fouet—As used herein, the drop in the voltage output of the Bank that occurs at the beginning of a discharge event. At the outset of a discharge event, the individual Cell voltages initially dip and then recover to a steady state voltage. See, e.g., https://www.sciencedirect.com/science/article/abs/pii/S037877530501565X (incorporated herein by reference).

Current Conversion Ratio-When a DC to AC power converter is employed, this represents the efficiency of converting DC current from the Bank to AC current during a Discharge Event. This ratio is entered into the BMS by the operator. When DC current is supplied directly from the Bank to the load, the efficiency is 100%.

Cutoff Voltage-1) When used in reference to a Bloc, the voltage at which a Bloc is determined to be approximately 80% discharged. Typically, each Cell in a Bloc has a cutoff voltage of 1.75 volts (however a different cutoff voltage may be employed in some circumstances). Accordingly, a Bloc comprised of six Cells typically has a cutoff voltage of 10.5 volts. 2) When used in reference to a Bank, the voltage at which the collection of Blocs comprising the Bank is determined to be approximately 80% discharged. For example, a Bank comprising 24 Cells, where each Cell has a 1.75 volt cutoff voltage, would have a cutoff voltage of 42 volts. Unless otherwise specified, as used herein the term Cutoff Voltage refers to the cutoff voltage of the Bank.

Discharge Current—the current supplied to the load by the Bank during a Discharge Event.

Discharge Event—the time during which load current is supplied by the Bank, for example, during a service outage.

Estimated Amp Hour Capacity-When used in connection with a String, an estimate of the amp hour capacity of the String before the occurrence of a discharge event based on the manufacturer supplied Specified Amp Hour Rating for the Blocs, including the manufacturer supplied discharge curves, and the Estimated Discharge Current. When used in connection with a Bank, the combined Adjusted Estimated Amp Hour Capacities of the Strings.

Estimated Discharge Current—An estimate of the Discharge Current calculated by dividing the Estimated Load Current by the Current Conversion Ratio.

Estimated Load Current—An estimate of the AC current or DC current required by the load under normal operating conditions (i.e., before a Discharge Event), entered by an operator.

Estimated Runtime-A calculated estimate of the time that will elapse between the beginning of a Discharge Event and the time that the Cutoff Voltage will be reached. Estimates of Runtime are continuously calculated during both normal system operation (i.e., when commercial AC is present and the Bank is charging) and during a Discharge Event, albeit by different methods.

Estimated Time to Cutoff—The estimated amount of time remaining during a Discharge Event before the Bank reaches the Cutoff Voltage. During a Discharge Event, the Estimated Runtime and the Estimated Time to Cutoff are synonymous.

Measured Discharge Current—The current supplied to the load by the Bank measured during a Discharge Event.

Quality Index ("QI")—A value, such as a percentage, that reflects the state of health of each String, including, for example, the internal admittance, state of charge, time since discharge, age, float current, temperature and other characteristics of each Bloc in the String. These data may be obtained from the BMS. For example, for each Bloc in the String, the QI may be calculated by comparing the admittance reported by the BMS to the admittance specified the manufacturer (or as the manufacturer specified admittance may be adjusted by the end user based on experience) to obtain a percentage change in admittance. These data may be further adjusted based on one or more of the battery characteristics noted above. The changes obtained for each Bloc may be averaged to obtain an average admittance change for the String. In one embodiment, the starting QI of the String may be 100% and adjusted downwardly as various subsequent measurements are taken by the BMS.

Specified Amp Hour Rating-When used in connection with a Bloc, the amp hour capacity of the Bloc specified by the manufacturer at a specific discharge current. When used in connection with a String, the amp hour capacity of the String based on a compilation, e.g., an average, of the manufacturer's specified amp hour capacity for each Bloc in the String.

String—A collection of Blocs connected in series.

Figure 1B:
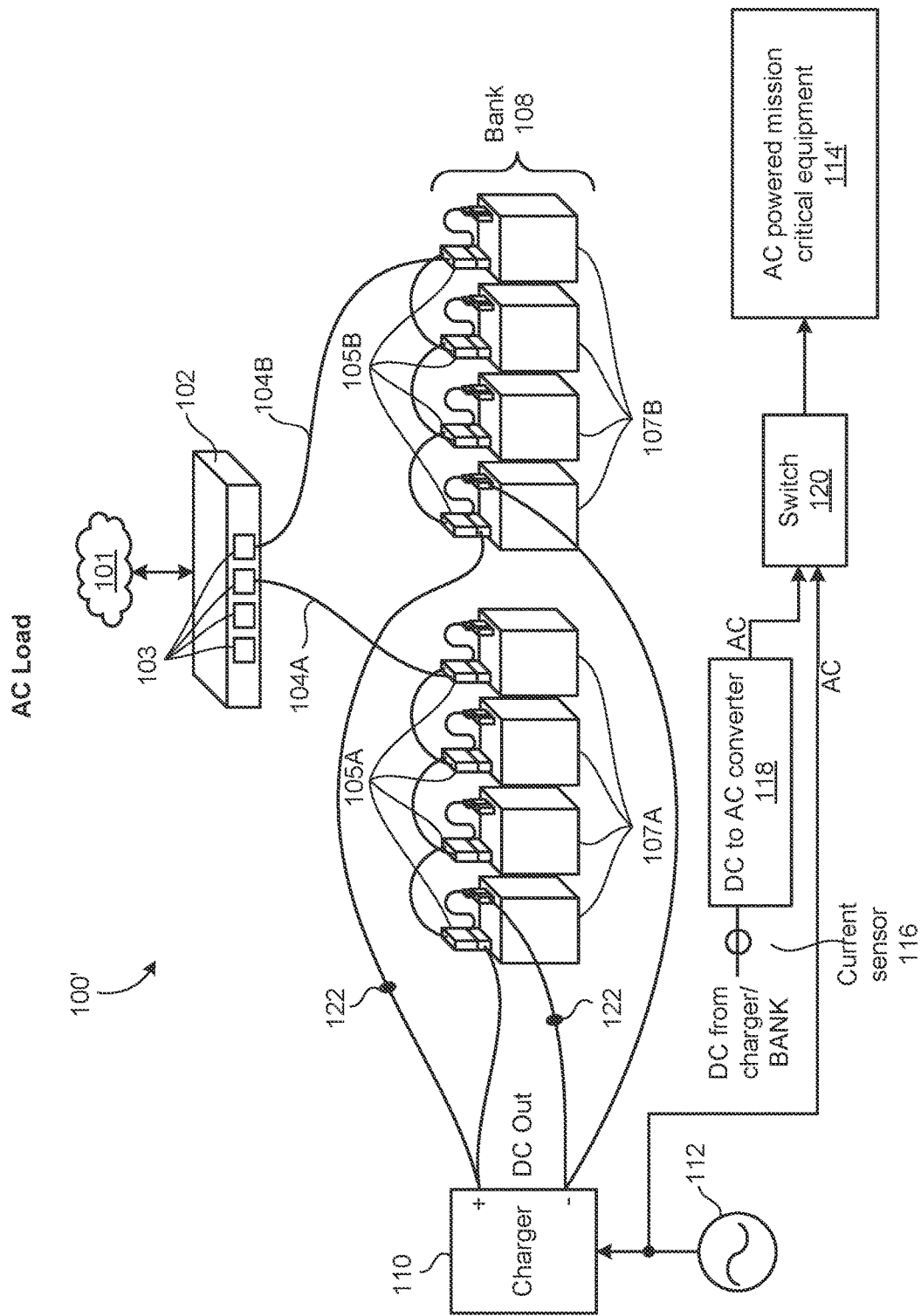
FIG. 1B is a block diagram of an exemplary battery backup and management system for an AC load.

Referring to the drawings, wherein like numerals represent like elements, there is illustrated in FIGS. 1A and 1B embodiments of an exemplary backup system 100, 100' for DC and AC loads respectively. Briefly, Bank 108 is comprised of Blocs 107A connected in series and Blocs 107B connected in series, each defining a String. The Strings are connected together in parallel to form a Bank 108. As more fully described in the References, each Bloc is equipped with a sensor 105A, 105B, that communicate with a site controller 102. The sensors 105 and the controller 102 define the BMS.

A charger 110 receives externally generated AC power 112, typically from a commercial electric utility company. The output of the charger is a DC voltage that charges the Blocs when AC power 112 is available. In the embodiment of FIG. 1A, the load 114 is a DC powered load. The charger 110 supplies DC current at a desired voltage to both the Bank and the load when commercial AC power is available. The Bank supplies DC current to the load 114 when commercial AC power is not available. In the embodiment of FIG. 1B, the load 114' is an AC powered load. When commercial AC power is available, it is supplied to the load via a transfer switch 120, and to the charger, which in turn supplies DC current to a DC to AC converter 118, such as an inverter. When commercial AC power is not available, the transfer switch allows AC current from the DC to AC converter 118 to be supplied to the load. Thus, during periods of a service outage, for example, the load 114' is powered by the Bank via the converter 118.

In both embodiments, the current drawn by the load may be measured via one or more DC current sensors 116. In the case of the embodiment of FIG. 1A, it will be appreciated that the current being supplied by the Bank during a service outage (Discharge Current) is the same as the current drawn by the load (hereinafter sometimes "load current"). In the case of the embodiment of FIG. 1B, due to conversion inefficiencies of the converter 118, the Discharge Current may be higher than the load current. In both cases, sensors 116, 116' supply information indicative of the amount of load current. It may be desirable to also measure the current supplied by each of the Blocs and/or Strings during charging (as a measure of charging current), and to measure the Discharge Current. Thus, one or more current sensors 122 may be supplied as desired on applicable wires to measure such currents.

As described in the References, the sensors 105 communicate certain Bloc information to a controller 102 via cables 104A, 104B received into ports 103. The sensors provide information to the controller about the health of each Bloc and report that, and other, information to a central monitoring location over a network 101. The information may include information relating to the health of each Bloc and Bloc temperature, Bloc voltage, and other internal parameters of the Bloc such as internal admittance and other RC characteristics. Data from the current sensors 116, 122 may also be supplied to the controller. The controller 102 comprises a memory and programmable microcontroller that may perform calculations according to program code relating to the state of health and operation of the Bank. A display may be provided for displaying this and other information, e.g., relating to the Blocs, the Bank and the load. The program code for performing the calculations described herein, and for calculating estimated runtime and other information, may be embodied in the controller memory and carried out by the microcontroller.

As shown in FIG. 1, there is a sensor 105 connected to the terminals of each battery. As explained U.S. U.S. Pat. No. 11,218,003, each sensor is adapted to generate a PWM signal and apply the PWM signal to its associated battery. Application of the PWM signal excites the battery and causes the battery to respond with a signal indicative of the battery's admittance. As also explained U.S. U.S. Pat. No. 11,218,003, admittance is an indication of the battery's health. The sensor may also measure and report other battery health indications, such as temperature, voltage, etc.

Figure 2:
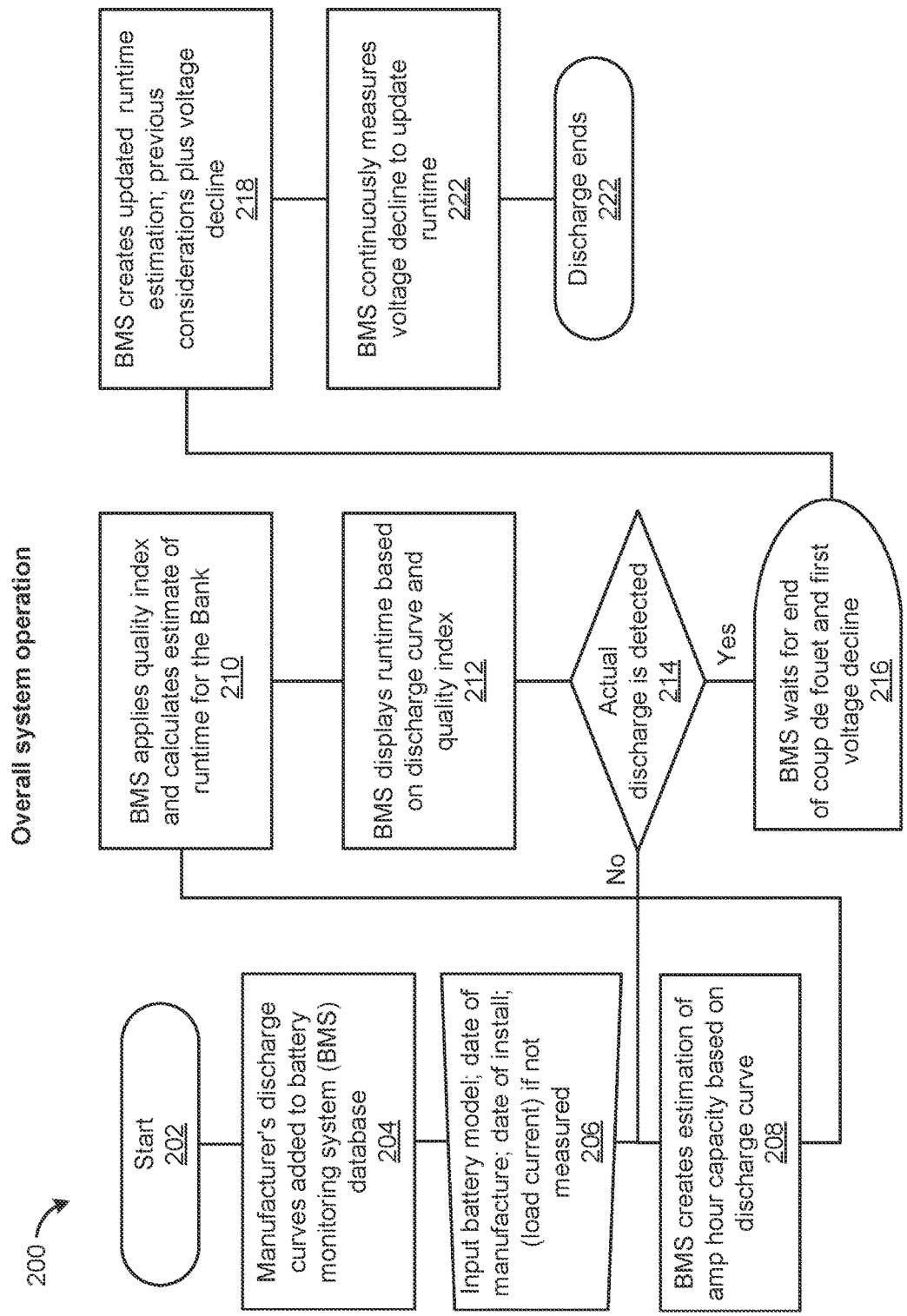
FIG. 2 is a flowchart illustrating one example of the overall system operation.

FIG. 2 is a flowchart showing the high level operation 200 of the program code. An operator or technician starts the process (202) by loading certain Bloc related information into a database embodied in the memory of the controller. As shown at 204 and 206, such information may include the manufacturer of the blocs, their model nos., the date of their manufacture and installation, manufacturer supplied data indicative of discharge current vs time to cutoff (discharge curve), and specified amp hour rating. The operator may enter additional information shown in FIG. 5, such as the number of cells per bloc, the expected life of the bloc, and the admittance of the cell when new. The code then calculates an Estimated Amp Hour Capacity of each String (208) based on the discharge curve data previously entered at 204. The code then applies a Quality Index to the Estimated Amp Hour Capacity (210) and calculates an Adjusted Estimated Amp Hour Capacity and an Estimated Runtime (212). If the Bank is not discharging current to the load (214) (i.e., there is not presently a Discharge Event), then the foregoing process is repeated. However, if the Bank has begun discharging current to the load (i.e., a Discharge Event has begun), the code monitors for the presence of the coup de fouet (216). After the coup de fouet has occurred, the code recalculates the Estimated Runtime (218) and thereafter continuously updates the Estimated Runtime (220) until the Discharge Event has ended (222).

Figure 3:
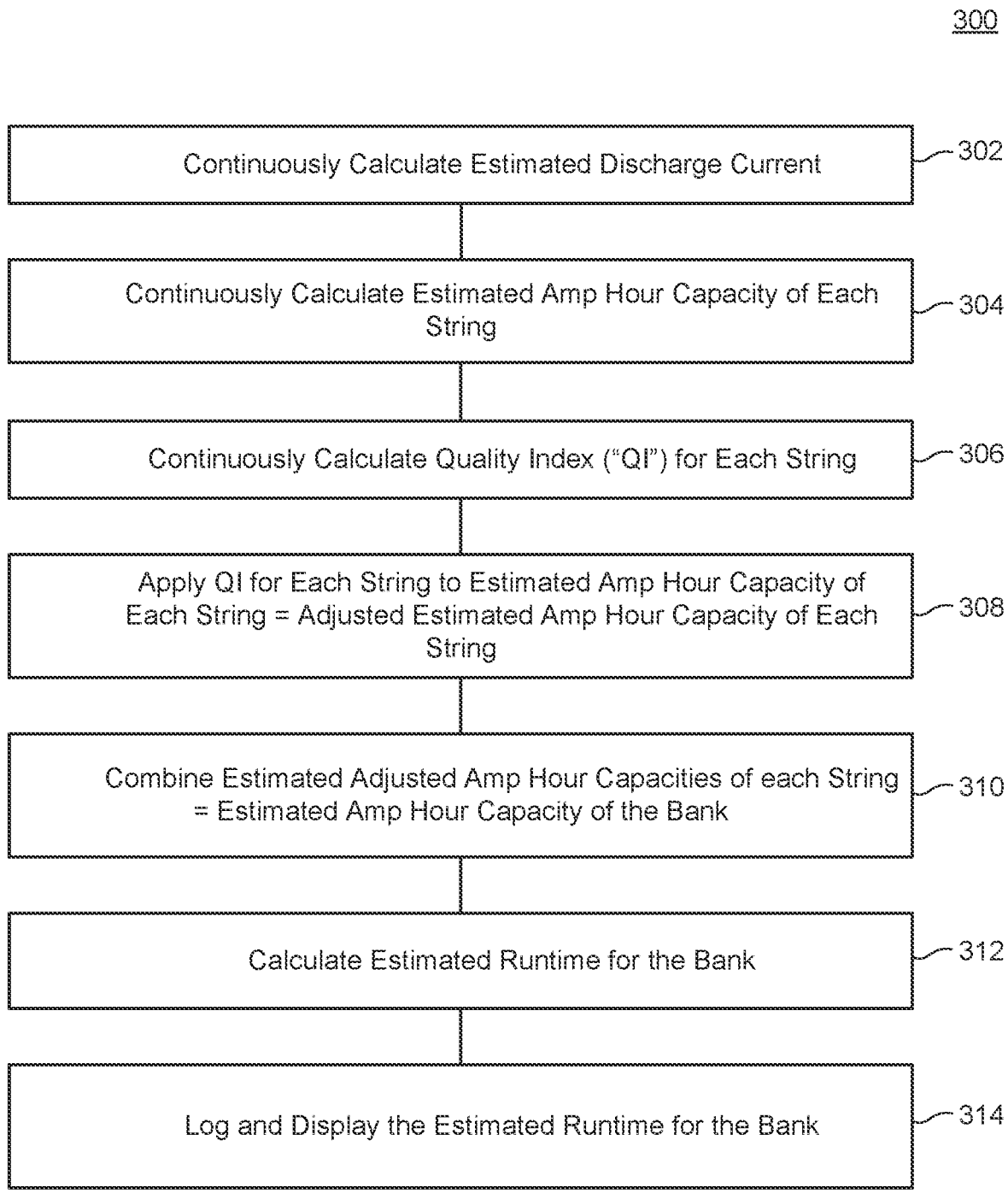
FIG. 3 is a flowchart illustrating one example of the system operation during normal operating conditions (charging period).
Figure 4A:
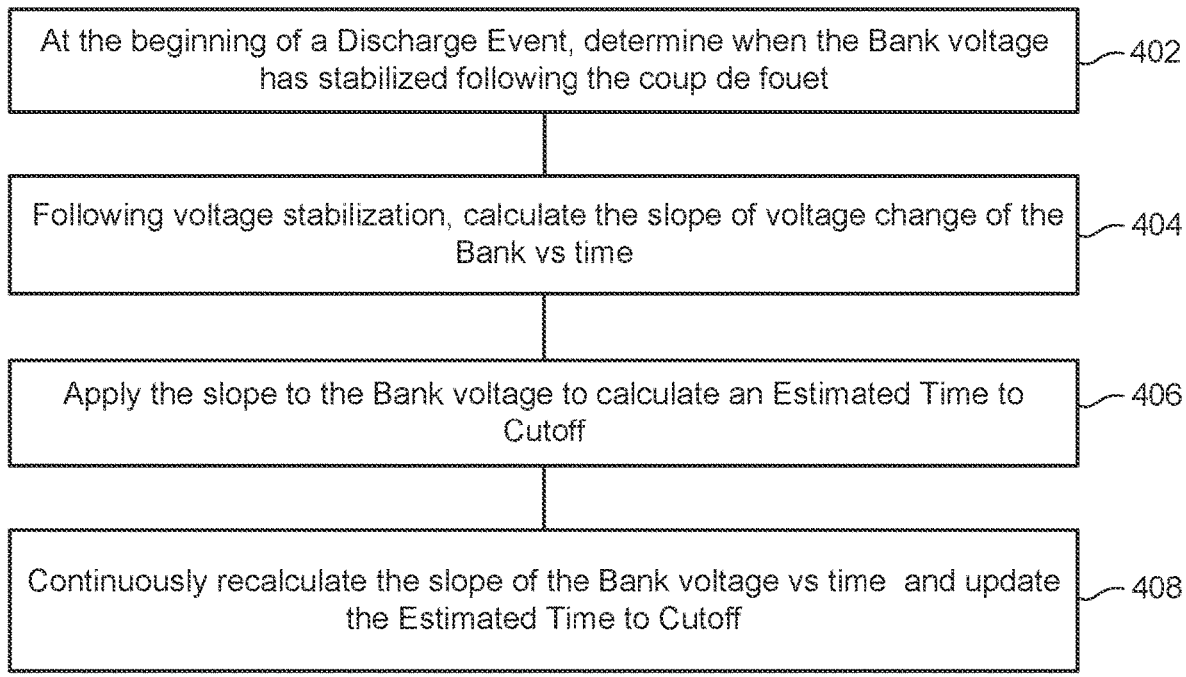
FIGS. 4A and 4B are a flowchart illustrating one example of the system operation during a discharge event.
Figure 4B:
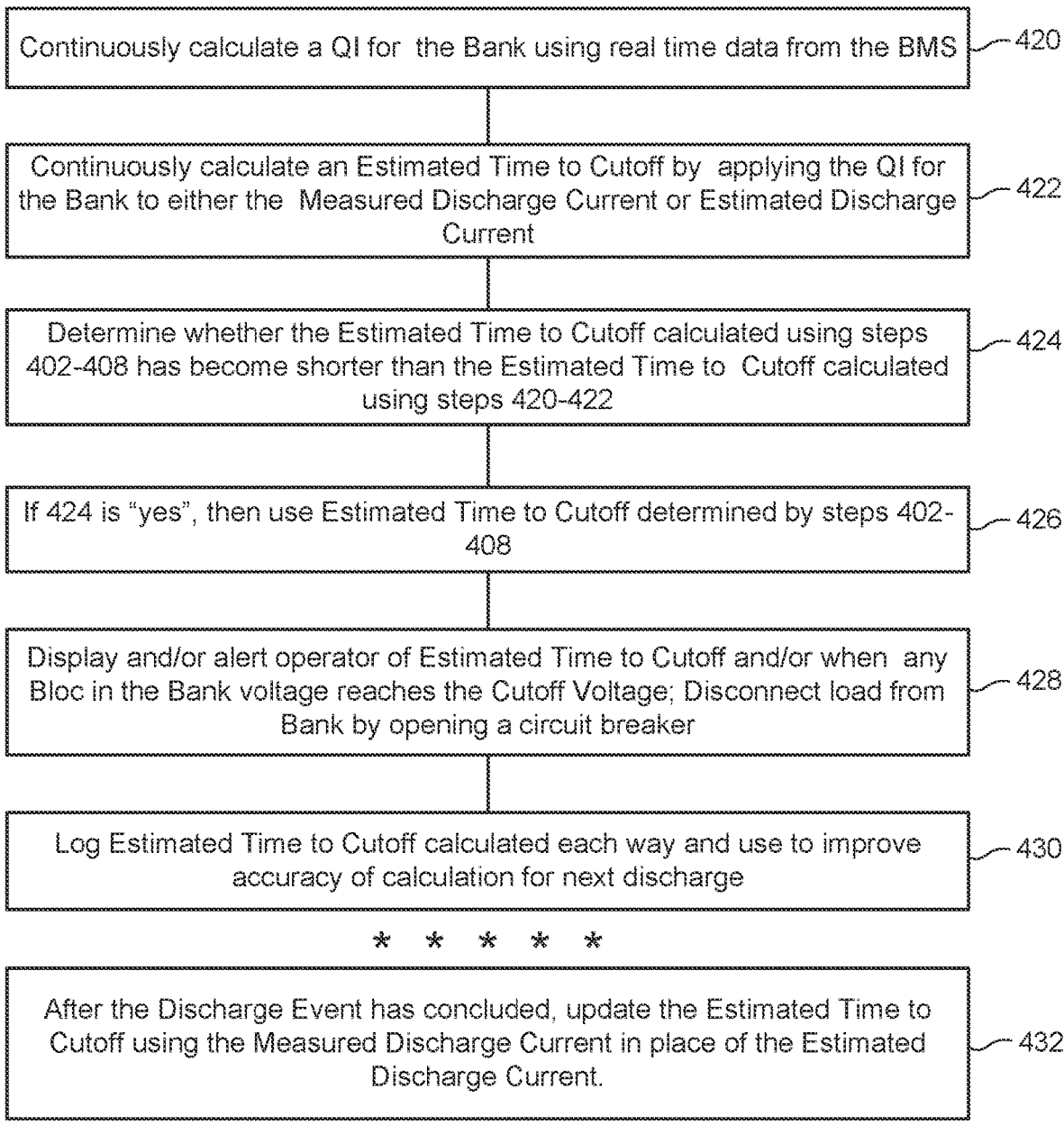

FIGS. 3, 4A and 4B illustrate further details of the foregoing. As is evident from these Figures, Estimated Runtime is continuously calculated during both normal system operation (FIG. 3) and during a Discharge Event (FIGS. 4A and 4B), but by different methods. In addition, during a Discharge Event, the Estimated Runtime is calculated by two alternative methods (FIGS. 4A and 4B).

FIG. 3 illustrates the code operation 300 during normal operation, i.e., when commercial AC power is available and there is not a Discharge Event. At 302, the code continuously calculates the Estimated Discharge Current. This calculation assumes that load current is substantially constant.

At 304, the code continuously calculates the Estimated Amp Hour Capacity of each String based on the manufacturer supplied discharge curves entered at 204, 206 and the Estimated Discharge Current. Using the data in FIG. 5, the Estimated Amp Hour Capacity of each String can be interpolated for various discharge scenarios. Thus, the Estimated Amp Hour Capacities of the Strings calculated at this juncture are based on the manufacturer supplied data and the currently calculated Estimated Discharge Current.

At 306, the QI for each String is calculated. At 308, the QI of each String is applied to the Estimated Amp Hour capacity of each String calculated at 304 to yield the Adjusted Estimated Amp Hour capacity of each String. When the QI is expressed as a percentage, for example, then this calculation may be carried out by multiplying the QI of each String to the Estimated Amp Hour Capacity of each String to yield the Adjusted Estimated Amp Hour Capacity of each String. At 310, the Adjusted Estimated Amp Hour Capacity of the Strings are added together to arrive at an Estimated Amp Hour Capacity of the Bank.

An Initial Estimated Runtime for the Bank is calculated at 312, based upon the Estimated Discharge Current and the Estimated Amp Hour Capacity of the Bank. This may be accomplished by dividing the Estimated Amp Hour Capacity of the Bank by the Estimated Discharge Current.

At 314, the Initial Estimated Runtime for the Bank is logged in the controller and may be displayed to the operator.

FIGS. 4A and 4B illustrate the code operation during a Discharge Event. FIGS. 4A and 4B show two methods 400, 400' for calculating Estimated Runtime during a Discharge Event. In the disclosed embodiment, both methods are employed, and may be used together to decide which is the more accurate estimate of runtime to be displayed to the operator during a Discharge Event. During a Discharge Event, the terms Estimated Time to Cutoff and Estimated Runtime refer to the same concept. The method 400 of FIG. 4A provides a first indication of the Estimated Time to Cutoff/Estimated Runtime during a Discharge Event. The method 400" of FIG. 4B provides a second indication of the Estimated Time to Cutoff/Estimated Runtime during a Discharge Event.

Referring to the first method 400 shown in FIG. 4A, once a Discharge Event has been detected, a determination is made as to when the Bank voltage has stabilized following the coup de fouet (402). As shown at 404, once it has been determined that the Bank voltage has stabilized, the slope of the Bank's voltage change vs. time is calculated as the Bank discharges current to the load. At 406, the slope is employed to calculate a first indication of the Estimated Time to Cutoff. As noted, this is also a first indication of the Estimated Runtime during the Discharge Event. As shown at 418, steps 404-406 are continuously repeated to update the Estimated Time to Cutoff/Estimated Runtime during the Discharge Event. This information is continuously logged and may be displayed to the operator.

Referring to the second method 400' shown in FIG. 4B, the QI is continuously calculated during the Discharge Event (420). As shown at 422, a second indication of the Estimated Time to Cutoff is calculated by applying the QI to the Estimated Discharge Current in a first instance and by applying the QI to the Measured Discharge Current in second and subsequent instances. This is also a second indication of Estimated Runtime. During a first instance of a Discharge Event or during a first calculation of QI during a Discharge Event, the Estimated Discharge Current may be used to calculate Estimated Time to Cutoff/Estimated Runtime, but in subsequent instances or calculations, the Measured Discharge Current may be used instead.

As noted, a determination may be made as to which calculation of Estimated Runtime should be displayed to the operator during a Discharge Event. At the beginning of a Discharge Event, the Estimated Runtime calculated by the method 400 of FIG. 4A will likely be longer that the Estimated Runtime calculated by the method 400' of FIG. 4B, and likely will not be an accurate representation of Estimated Runtime. However, when the Estimated Runtime calculated by the method 400 becomes shorter than the Estimated Runtime calculated by the method 400', then the method 400 will provide a more accurate Estimated Runtime. This is illustrated at step 424, where the first indication of the Estimated Runtime (calculated according to the method of FIG. 4A) is compared to the second indication of Estimated Runtime calculated according to FIG. 4B. If the first indication of Estimated Runtime is shorter than the second indication of Estimated Runtime, then the first indication of Estimated Runtime may be employed to alert the operator of the remaining Estimated Runtime (426). Otherwise, the second indication calculated according to FIG. 4B may be employed. As shown at 428, as a safety measure, the BMS may cause a circuit breaker to open and disconnect the load from the Bank if the Estimated Runtime has elapsed (i.e., the Estimated Time to Cutoff has been reached). At 430, the Estimated Runtime calculated by both methods 400 and 400' illustrated in FIGS. 4A and 4B are logged.

At 432, the previously calculated Estimated Discharge Current is recalculated and updated using the Measured Discharge Current instead of the Estimated Load Current.

There has been described an apparatus and method that employs a BMS to accurately calculate an Estimated Runtime of Bank in a battery backup system. Though reference has been made in the foregoing to Blocs, Strings and Banks, the teachings of the instant disclosure may be applied to other battery forms and structures, and to battery technologies other than lead acid batteries. Thus, the apparatus and method described herein may be embodied in other specific forms without departing from the spirit or essential attributes thereof. Accordingly, reference should be made to the appended claims, rather than the foregoing specification, for indicating the scope of the invention.

The invention claimed is:

1. A system for providing an indication of health and a runtime of a battery backup both during a time when a normal supply of current is powering a load, defining normal operation, and during a time when the normal supply of current is not present and the backup is supplying the current to power the load, defining a discharge event, wherein the backup comprises a plurality of series connected blocs defining a bank, each series of connected blocs defining a string, the system comprising:

a) a plurality of sensors adapted to be coupled to the blocs and to generate pulse width modulated (PWM) signals, excite the blocs by applying the PWM signals thereto, measure each bloc's response to the application of the PWM signals and provide response signals indicative of a health related characteristic of the blocs, including sensors for providing signals indicative of bank voltage, current supplied by the bank at least during discharge events and charging current supplied to the bank during normal operation;
b) a controller adapted to receive the signals from the sensors and comprising a processor and memory having battery manufacturer information and program code stored therein, the program code, when executed, causing the processor to:
i) during normal operation:
A) determine an estimate of an amount of current required to be supplied by the bank during an occurrence of the discharge event based at least in part upon battery information stored in the memory, defining an estimated discharge current;
B) continuously calculate an estimated amp hour capacity of each string based at least in part upon the estimated discharge current;
C) based at least on the response signals, continuously calculate a value indicative of the health of each string, defining a quality index;
D) continuously calculate an adjusted estimated amp hour capacity of each string by applying the quality index to the estimated amp hour capacity of the string;
E) continuously calculate an estimated amp hour capacity of the bank based upon the number of strings and the adjusted estimated amp hour capacity of each string; and,
F) continuously calculate a first estimated runtime of the bank based on the estimated amp hour capacity of the bank and the estimated discharge current;
ii) during the discharge event:
A) based at least in part on one or more of the signals, detect the occurrence of a coup de fouet;
B) based at least in part on one or more of the signals, determine when the voltage level of the bank has stabilized after the occurrence of the coup de fouet, and thereafter continuously:
1) Calculate a change of bank voltage vs. time, defining a voltage slope; and,
2) Calculate an estimated time to cutoff based on the voltage slope and bank voltage, defining a second estimated runtime;
C) continuously:
1) Calculate the quality index;
2) Calculate a third estimated runtime by applying the quality index to one of measured discharge current provided by at least one of the sensors or the estimated discharge current, wherein the estimated discharge current is employed in a first instance of a discharge event and the measured discharge current is employed in subsequent discharge events;
3) Compare the second and third estimated runtimes;
4) Selecting the shortest of the second and third estimated runtime, defining the selected estimated runtime;
the program code further causing the controller to transmit to a central monitoring location via a network at least signals indicative of the quality index, the first estimated runtime during normal operation and the selected estimated runtime during the discharge event and further causing a display to show the first estimated runtime during normal operation and the selected estimated runtime during the discharge event, wherein there is further stored in the memory a cutoff voltage for the blocs in the bank and the program code causes a circuit breaker to trip and disconnect the bank from the load if any bloc in the bank has reached the cutoff voltage.

2. The system according to claim 1 wherein there is further stored in the memory an indication of an efficiency of converting current from the bank to AC current during a discharge event, defining a current conversion ratio, and an indication of estimated current required by the load during normal operation, defining an estimated load current, and wherein the step of providing the estimated discharge current comprises applying the current conversion ratio to the estimated load current.

3. The system according to claim 2 wherein, following the conclusion of the discharge event, the step of providing the estimated discharge current comprises applying the current conversion ration to the measured discharge current instead of to the estimated load current.

4. The system according to claim 1 wherein there is further stored in the memory an indication of estimated current required by the load during normal operation, defining an estimated load current, and the step of providing the estimated discharge current comprises retrieving the estimated load current from the memory and employing it as the estimated discharge current.

5. The system according to claim 1 wherein the amp hour capacity of each string is calculated employing data indicative of an amp hour capacity and a discharge curve of each bloc stored in the memory.

6. The system according to claim 1 wherein there is further stored in the memory data indicative of one or more characteristics of each bloc and the quality index is calculated based on a comparison of one or more of the stored characteristics to one or more of the characteristics based on the data provided by the sensors.

7. The system according to claim 1 wherein each bloc is a lead acid bloc.

8. The system according to claim 1 wherein at least one health characteristic is a bloc admittance.

9. A system for providing an indication of health and a runtime of a battery backup system both during a time when a normal supply of current is powering a load, defining normal operation, and during a time when the normal supply of current is not present and the backup system is supplying current to power the load, defining a discharge event, the system comprising a plurality of sensors, at least a portion of the sensors adapted to be coupled to the batteries and to generate and apply pulse width modulated (PWM) signals thereto so as excite the batteries and cause the batteries to generate a response signal indicative of at least one health related characteristic thereof, a plurality of batteries defining a bank, including sensors for generating signals indicative of bank voltage, current supplied by the bank at least during discharge events and charging current supplied to the bank during normal operation, the bank being defined by a plurality of series connected batteries each defining a string, and a controller comprising a memory, a processor and program code stored in the memory for execution by the processor, there further being stored in the memory information indicative of an efficiency of converting current from the bank to AC current during a discharge event, defining a current conversion ratio, and an indication of estimated current required by the load during normal operation, defining an estimated load current, the program code, when executed, causing the processor to:
a. during normal operation:
i) provide an estimate of an amount of current required to be supplied by the bank during an occurrence of the discharge event based at least in part upon battery information stored in the memory by applying the current conversion ratio to the estimated load current, defining an estimated discharge current;
ii) continuously calculate an estimated amp hour capacity of each string based at least in part upon the estimated discharge current;
iii) receive the response signals from the sensors, and based at least in part thereon, continuously calculate a value indicative of the health of each string, defining a quality index;
iv) continuously calculate an adjusted estimated amp hour capacity of each string by applying the quality index to the estimated amp hour capacity of the string;
v) continuously calculate an estimated amp hour capacity of the bank based upon the number of strings and the adjusted estimated amp hour capacity of each string;
vi) continuously calculate a first estimated runtime of the bank based on the estimated amp hour capacity of the bank and the estimated discharge current;
b. during the discharge event:
i) receive the signals from one or more of the sensors, and based at least in part thereon, detect the occurrence of a coup de fouet;
ii) receive the signals from the sensors and based at least in part thereon, determine when the voltage level of the bank has stabilized after the occurrence of the coup de fouet, and thereafter continuously:
A. based at least in part upon the signals received from one or more of the sensors, calculate a change of bank voltage vs. time, defining a voltage slope; and,
B. calculate an estimated time to cutoff based on the voltage slope and bank voltage provided by at least one of the sensors, defining a second estimated runtime;
iii) continuously:
A. calculate the quality index;
B. calculate a third estimated runtime by applying the quality index to one of a measured discharge current or the estimated discharge current provided by at least one of the sensors, wherein the estimated discharge current is employed in a first instance of a discharge event and the measured discharge current is employed in subsequent discharge events;
C. compare the second and third estimated runtimes;
D. selecting the shortest of the second and third estimated runtime, defining the selected estimated runtime; and,
E. following the conclusion of the discharge event, applying the current conversion ration to the measured discharge current instead of to the estimated load current to provide the estimated discharge current;
the program code further causing the controller to transmit to a central monitoring location via a network at least signals indicative of the quality index, the first estimated runtime during normal operation and the selected estimated runtime during the discharge event and further causing a display to show the first estimated runtime during normal operation and the selected estimated runtime during the discharge event, wherein there is stored in the memory a cutoff voltage for the batteries in the bank and the program code further causes a circuit breaker to trip and disconnect the bank from the load if any battery in the bank has reached the cutoff voltage.

10. The system according to claim 9 wherein amp hour capacity of each string is calculated employing data indicative of an amp hour capacity and a discharge curve of each battery stored in the memory.

11. The system according to claim 9 wherein there is further stored in the memory data indicative of one or more characteristics of each battery and the quality index is calculated based on a comparison of one or more of the stored characteristics to one or more of the characteristics based on the data provided by the sensors.

12. The system according to claim 9 wherein each battery is a lead acid bloc.

13. A method for providing an indication of health and a runtime of a battery backup system both during a time when a normal supply of current is powering a load, defining normal operation, and during a time when the normal supply of current is not present and the backup system is supplying the current to power the load, defining a discharge event, the backup system comprising a plurality of sensors each coupled to a respective battery and adapted to generate a pulse width modulated (PWM) signal and apply the PWM signal to a respective battery so as excite the battery and provide a response signal indicative of at least one health related characteristic of the respective battery, a plurality of batteries defining a bank, including sensors for providing signals indicative of bank voltage, current supplied by the bank at least during discharge events and charging current supplied to the bank during normal operation, each bank being defined by a plurality of series connected batteries each defining a string, and a controller comprising a memory, a processor and program code stored in the memory for execution by the processor, the program code, when executed, causing the processor to:
a. during normal operation:
i) provide an indication of an amount of current required to be supplied by the bank during an occurrence of the discharge event based at least in part upon battery information stored in the memory, defining an estimated discharge current;
ii) continuously calculate an estimated amp hour capacity of each string based at least in part upon the estimated discharge current;
iii) receive the signals from one or more of the sensors, and based at least in part thereon, continuously calculate a value indicative of the health of each string, defining a quality index;
iv) continuously calculate an adjusted estimated amp hour capacity of each string by applying the quality index to the estimated amp hour capacity of the string;
v) continuously calculate an estimated amp hour capacity of the bank based upon the number of strings and the adjusted estimated amp hour capacity of each string;
vi) continuously calculate a first estimated runtime of the bank based on the estimated amp hour capacity of the bank and the estimated discharge current;

b. during the discharge event:
  i) receive the signals from one or more of the sensors, and based at least in part thereon, detect the occurrence of a coup de fouet;
  ii) receive the signals from one or more of the sensors and based at least in part thereon, determine when the voltage level of the bank has stabilized after the occurrence of the coup de fouet, and thereafter continuously:
    A. based at least in part upon the signals received from one or more of the sensors, calculate a change of bank voltage vs. time, defining a voltage slope; and,
    B. calculate an estimated time to cutoff based on the voltage slope and bank voltage provided by at least one the sensors, defining a second estimated runtime;
  iii) continuously:
    A. calculate the quality index;
    B. calculate a third estimated runtime by applying the quality index to one of a measured discharge current provided by at least one of the sensors or the estimated discharge current, wherein the estimated discharge current is employed in a first instance of a discharge event and the measured discharge current is employed in subsequent discharge events;
    C. compare the second and third estimated runtimes; and,
    D. selecting the shortest of the second and third estimated runtime, defining the selected estimated runtime;

the program code further causing the controller to transmit to a central monitoring location via a network at least signals indicative of the quality index, the first estimated runtime during normal operation and the selected estimated runtime during the discharge event and further causing a display to show the first estimated runtime during normal operation and the selected estimated runtime during the discharge event, wherein there is stored in the memory a cutoff voltage for the batteries in the bank and the program code causes a circuit breaker to trip and disconnect the bank from the load if any battery in the bank has reached the cutoff voltage.

14. The method according to claim 13 wherein there is further stored in the memory an indication of an efficiency of converting current from the bank to AC current during a discharge event, defining a current conversion ratio, and an indication of estimated current required by the load during normal operation, defining an estimated load current, and wherein the step of providing the estimated discharge current comprises applying the current conversion ratio to the estimated load current.

15. The method according to claim 14 wherein, following the conclusion of the discharge event, the step of providing the estimated discharge current comprises applying the current conversion ration to the measured discharge current instead of to the estimated load current.

16. The method according to claim 13 wherein there is further stored in the memory data indicative of one or more characteristics of each battery and the quality index is calculated based on a comparison of one or more of the stored characteristics to one or more of the characteristics based on the data provided by the sensors.

* * * * *